(12) United States Patent
Saito et al.

(10) Patent No.: US 11,460,932 B2
(45) Date of Patent: Oct. 4, 2022

(54) INPUT DEVICE AND INPUT SYSTEM

(71) Applicant: Panasonic Intellectual Property Management Co., Ltd., Osaka (JP)

(72) Inventors: Yuta Saito, Okayama (JP); Masaaki Yamabayashi, Okayama (JP); Ryo Nakae, Okayama (JP); Kenichi Matsumoto, Okayama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/290,688

(22) PCT Filed: Oct. 18, 2019

(86) PCT No.: PCT/JP2019/041222
§ 371 (c)(1),
(2) Date: Apr. 30, 2021

(87) PCT Pub. No.: WO2020/090535
PCT Pub. Date: May 7, 2020

(65) Prior Publication Data
US 2022/0011879 A1   Jan. 13, 2022

(30) Foreign Application Priority Data

Nov. 2, 2018   (JP) ............................. JP2018-207690

(51) Int. Cl.
*G06F 3/0338* (2013.01)
*G06F 3/044* (2006.01)
*H03K 17/96* (2006.01)

(52) U.S. Cl.
CPC ............ *G06F 3/0338* (2013.01); *G06F 3/044* (2013.01); *H03K 17/962* (2013.01); *G06F 2203/04105* (2013.01); *G06F 2203/04108* (2013.01)

(58) Field of Classification Search
None
See application file for complete search history.

(56) References Cited

U.S. PATENT DOCUMENTS

| 2004/0104727 | A1 | 6/2004 | Morimoto | |
| 2012/0228111 | A1* | 9/2012 | Peterson | H03K 17/98 200/600 |
| 2018/0081437 | A1* | 3/2018 | Taylor | G06F 3/0414 |

FOREIGN PATENT DOCUMENTS

| JP | 2004-045243 A | 2/2004 |
| JP | 2012-004129 A | 1/2012 |

(Continued)

OTHER PUBLICATIONS

International Search Report issued in corresponding Internationall Patent Application No. PCT/JP2019/041222, dated Dec. 24, 2019, with English translation.

*Primary Examiner* — Stephen T. Reed
(74) *Attorney, Agent, or Firm* — McDermott Will & Emery LLP

(57) ABSTRACT

An input device includes a pressure sensitive unit and a sensing unit. The pressure sensitive unit includes a clicking part and a pressure sensor. The clicking part has a press surface and is configured to provide a sense of click to an operation body which applies pushing force to the press surface. The pressure sensor is disposed on an opposite side of the clicking part from the press surface. The sensing unit is aligned with the pressure sensitive unit when viewed from a front side of the press surface and is configured to sense (Continued)

that the operation body comes in proximity to or comes into contact with a second detection surface.

16 Claims, 11 Drawing Sheets

(56) References Cited

FOREIGN PATENT DOCUMENTS

| JP | 2017-088105 A | 5/2017 |
|---|---|---|
| JP | 2018-032122 A | 3/2018 |

* cited by examiner

US 11,460,932 B2

INPUT DEVICE AND INPUT SYSTEM

CROSS-REFERENCE OF RELATED APPLICATIONS

This application is the U.S. National Phase under 35 U.S.C. § 371 of International Patent Application No. PCT/JP2019/041222, filed on Oct. 18, 2019, which in turn claims the benefit of Japanese Application No. 2018-207690, filed on Nov. 2, 2018, the entire disclosures of which Applications are incorporated by reference herein.

TECHNICAL FIELD

The present disclosure generally relates to input devices and input systems, and specifically, to an input device to be used for input to various kinds of electronic devices and an input system including the input device.

BACKGROUND ART

Patent Literature 1 describes an input device. The input device includes a pressure sensor and an elastic body. The pressure sensor is disposed in the elastic body. A person giving an input operation, for example, twists or pulls the elastic body to elastically deform the elastic body. The input device detects elastic deformation at this time by the pressure sensor and outputs an input signal based on the pressure sensor.

The input device described in the Patent Literature 1 and configured to detect a complicated dynamic variation in the elastic body by the pressure sensor, however, cannot provide the person giving the input operation with a sense of click. Moreover, an input device is required which is configured to handle various types of operations without inhibiting provision of the sense of click.

CITATION LIST

Patent Literature

Patent Literature 1: JP 2012-004129 A

SUMMARY OF INVENTION

In view of the foregoing, it is an object of the present disclosure to provide an input device and an input system which are configured to handle various types of operations while reducing inhibitions against provision of a sense of click.

An input device of one aspect of the present disclosure includes a pressure sensitive unit and a sensing unit. The pressure sensitive unit includes a clicking part and a pressure sensor. The clicking part has a press surface and is configured to provide a sense of click to an operation body which applies pushing force to the press surface. The pressure sensor is disposed on an opposite side of the clicking part from the press surface. The sensing unit is aligned with the pressure sensitive unit when viewed from a front side of the press surface and is configured to sense that the operation body comes in proximity to or touches a detection surface.

An input system of one aspect of the present disclosure includes the input device, a first acquirer, a second acquirer, and a determiner. The first acquirer is configured to acquire a first signal output from the pressure sensor of the pressure sensitive unit. The second acquirer is configured to acquire a second signal output from the sensing unit. The determiner is configured to determine, based on the first signal and the second signal, an operational state of the operation body.

DESCRIPTION OF EMBODIMENTS (1) Schema

The drawings to be referred to in the following description of the embodiment are all schematic representations. That is to say, the ratio of the dimensions (including thicknesses) of respective constituent elements illustrated on the drawings does not always reflect their actual dimensional ratio.

Figure 1:
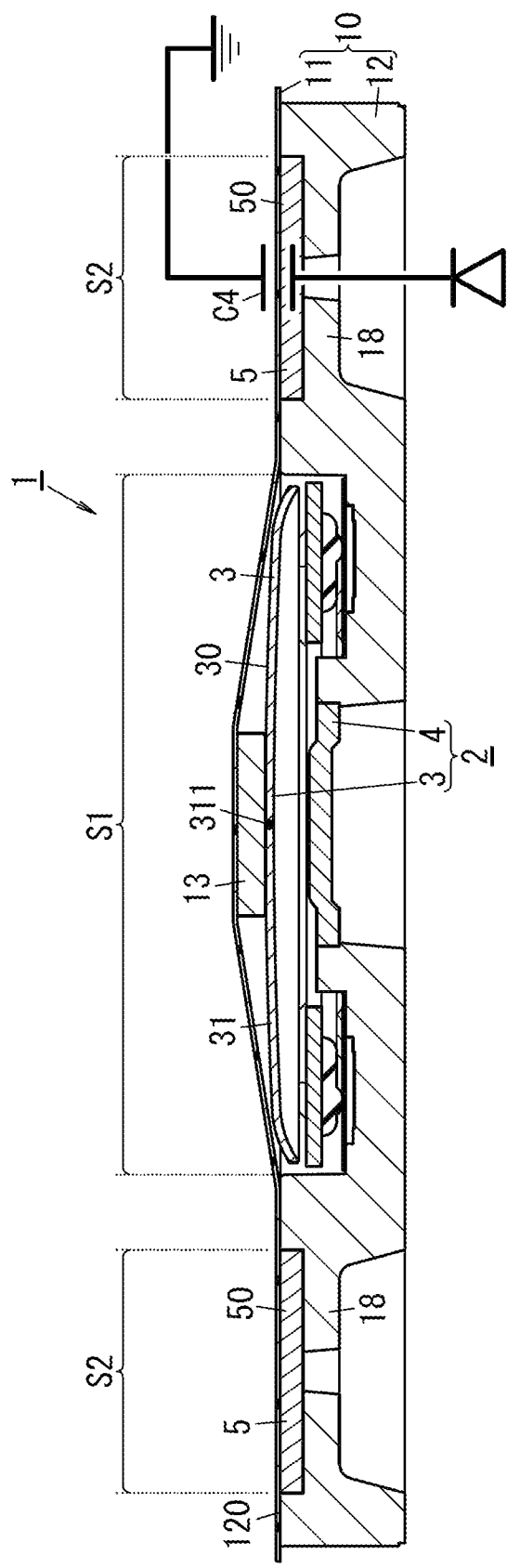
FIG. 1 is a sectional view illustrating an input device according to an embodiment.
Figure 3:
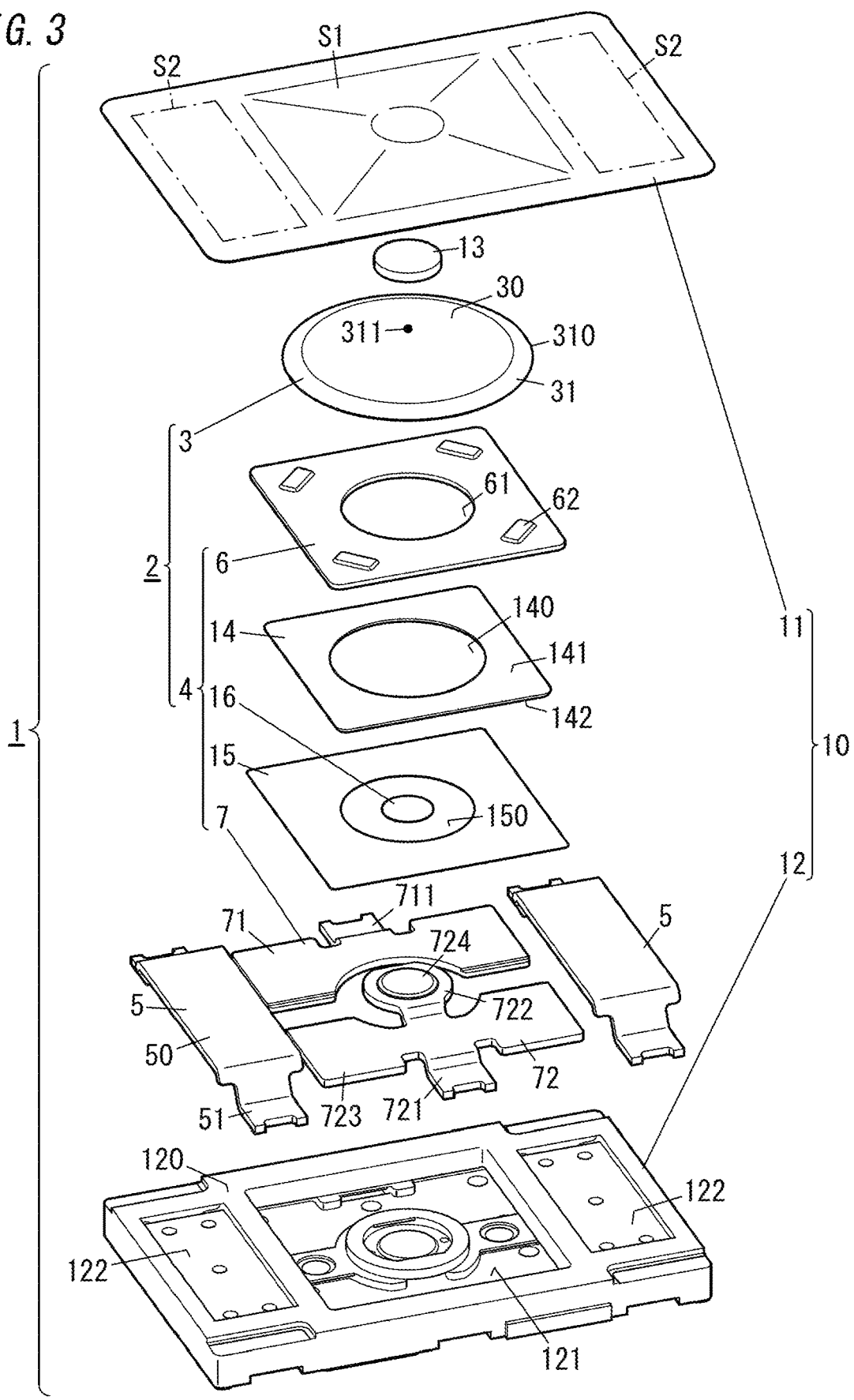
FIG. 3 is an exploded perspective view illustrating the input device.

As illustrated in FIGS. 1 and 3, an input device 1 of the present embodiment includes a pressure sensitive unit 2 and one or more sensing units 5. This embodiment includes, for example, two sensing units 5.

As illustrated in FIGS. 1 and 3, the pressure sensitive unit 2 includes a clicking part 3 and a pressure sensor 4. The clicking part 3 has a press surface 30 and is configured to provide a sense of click (e.g., a click sound) to an operation body U1 (see FIGS. 7A to 7D) which applies pushing force to the press surface 30. In this embodiment, the operation body U1 is assumed to be, for example, a fingertip of a person (i.e., part of a living body) but is not particularly limited to this example. The operation body U1 may include part of a living body and an item (e.g., a glove) covering the part of the living body. The operation body U1 may further include an item (i.e., a stylus-type operation member) held by a living body. The pressure sensor 4 is disposed on an opposite side of the clicking part 3 from the press surface 30. The pressure sensor 4 of the present embodiment is, for example, a capacitive sensor.

Figure 4:
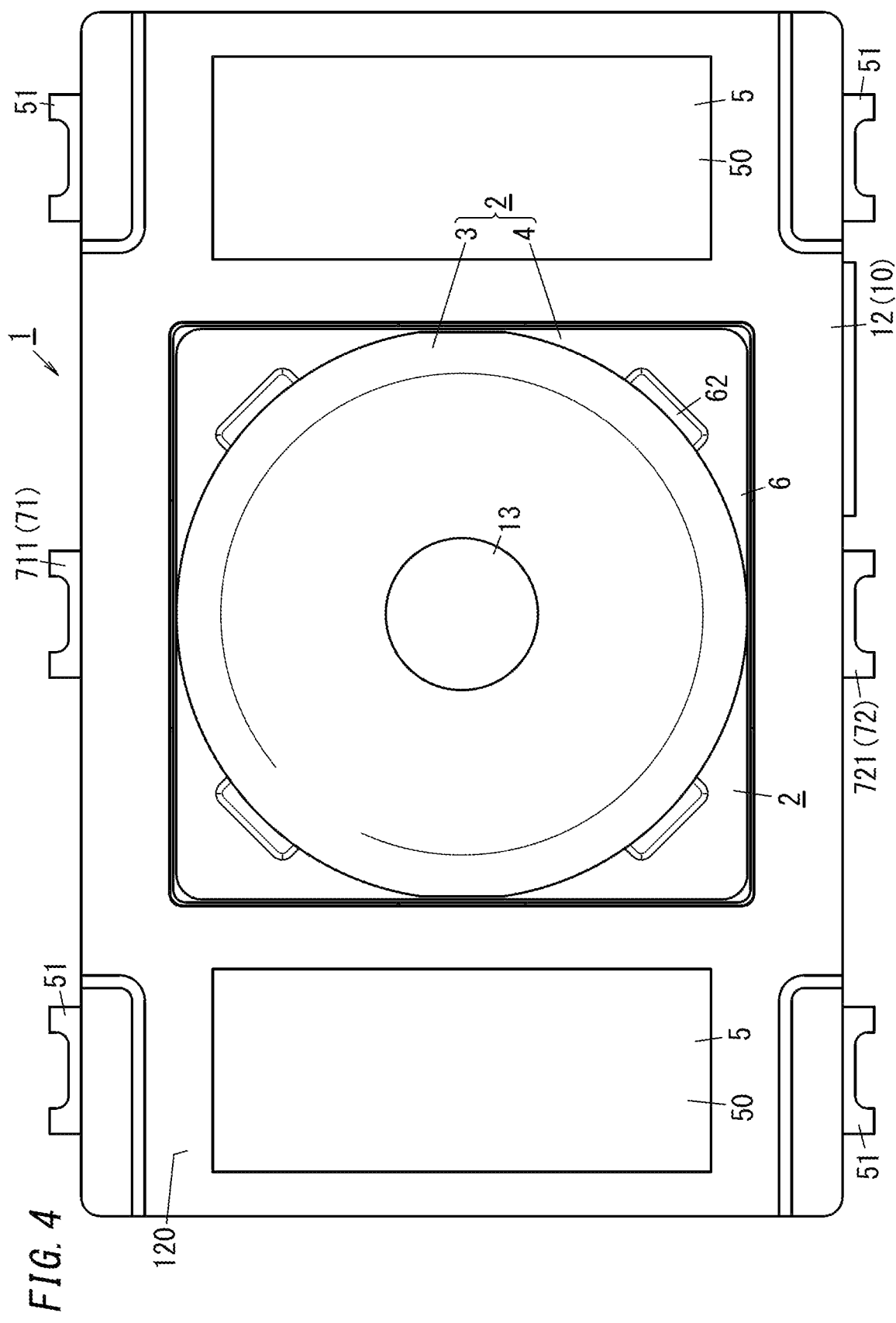
FIG. 4 is a plan view illustrating the input device with its cover being removed.

As illustrated in FIG. 4, each sensing unit 5 is aligned with the pressure sensitive unit 2 when viewed from a front side of the press surface 30 and is configured to sense that the operation body U1 comes in proximity to or touches a detection surface. In this embodiment, the detection surface is assumed to be a partial area (surface) of a surface of a cover (a film) 11 facing the sensing unit 5.

The sensing unit 5 of the present embodiment is, for example, a capacitive touch sensor (a touch switch) but may be a capacitive proximity sensor having an increased sensitivity to detect an object that comes in proximity thereto. The sensing unit 5 is not limited to the capacitive sensor but may be an optical sensor, an induction sensor, a magnetic sensor, or the like. The input device 1 is not limited to a configuration of only directly receiving pushing force from the operation body U1 but may be configured to receive the pushing force via an operation plate (an operation handle) T1 (see FIGS. 7A to 7D) provided in front of the cover 11.

Figure 5:
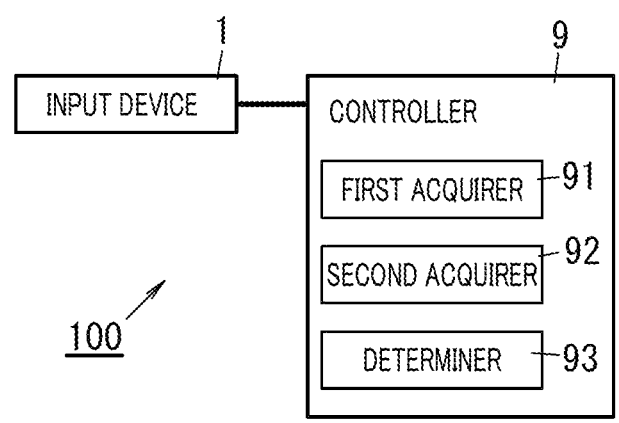
FIG. 5 is a block diagram schematically illustrating an input system of an embodiment.
Figure 6:
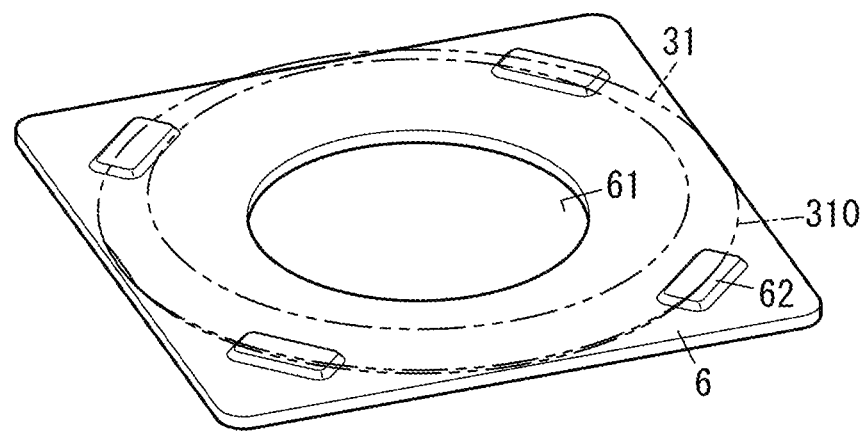
FIG. 6 is a perspective view illustrating the clicking part and a first electrode of the input device.

As illustrated in FIG. 5, an input system 100 according to the present embodiment includes the input device 1, a first acquirer 91, a second acquirer 92, and a determiner 93. The first acquirer 91 acquires a first signal output from the pressure sensor 4 of the pressure sensitive unit 2. The second acquirer 92 acquires a second signal output from the sensing unit 5. The determiner 93 determines an operational state of the operation body U1 based on the first signal and the second signal.

According to this configuration, aligning the pressure sensitive unit 2 and each sensing unit 5 with each other enables various types of operations to be handled while reducing inhibitions against provision of a sense of click. The various types of operations are, for example, an operation of pushing the pressure sensitive unit 2 at a location shifted to the sensing unit 5, an operation of pushing the pressure sensitive unit 2 at a location apart from the sensing unit 5, and an operation of a living body coming, from a side of the sensing unit 5, in proximity to the pressure sensitive unit 2.

(2) Details (2.1) Overall Configuration

Overall structures of the input device 1 and the input system 100 according to the present embodiment will be described in detail below with reference to FIGS. 1 to 7D.

As illustrated in FIG. 5, the input system 100 includes the input device 1, a controller 9, and the like. The input system 100 is applicable to various kinds of electronic devices. The input device 1 may be held in a housing of an electronic device. The controller 9 may be accommodated in the housing of the electronic device. The controller 9 may output, to a circuit module accommodated in the housing of the electronic device, a control signal in accordance with an input from the input device 1.

The input device 1 includes the pressure sensitive unit 2 and the two sensing units 5 as described above. As illustrated in FIG. 3, the input device 1 further includes a housing 10 and a pusher 13.

(2.2) Housing

As illustrated in FIGS. 1 and 3, the housing 10 of the input device 1 accommodates the pressure sensitive unit 2, the two sensing units 5, and the pusher 13. The housing 10 includes the cover 11 and a body 12. The body 12 has a flat quadrangular (e.g., square) box shape and has a first surface (an upper surface in FIGS. 1 and 3) in a thickness direction thereof, and the first surface has an opening. The cover 11 is in the form of a quadrangular (e.g., square) film. The cover 11 is attached to the first surface of the body 12 to cover the opening in the first surface of the body 12.

The cover 11 and the body 12 are electrically insulating. For example, the cover 11 and the body 12 are made of an electrically insulating resin material. In particular, the cover 11 is flexible. Thus, the operation body U1 (see FIGS. 7A to 7D) can push, via the cover 11, the pressure sensitive unit 2 accommodated in the housing 10.

The cover 11 has a surface (in FIG. 3, an upper surface) which is located at an opposite side from the pressure sensitive unit 2 and the two sensing units 5 and which serves as a detection surface of the input device 1. In the following description, of the detection surface of the input device 1, an area corresponding to the pressure sensitive unit 2 may be referred to as a first detection surface S1, and two areas corresponding to the two sensing units 5 may be referred to as second detection surfaces S2 (see FIGS. 1 and 3). The two second detection surfaces S2 in FIG. 3 are virtually indicated by long dashed short dashed lines.

The first detection surface S1 slightly protrudes in a direction away from the pressure sensitive unit 2. The first detection surface S1 is a substantially square area when viewed from a front side of the cover 11 (see FIG. 3). The first detection surface S1 has a central part having a circular flat area, and the cover 11 has a back surface having an area which corresponds to the central part and in which the pusher 13 is stably positioned.

In contrast, the two second detection surfaces S2 are flat areas (surfaces). The two second detection surfaces S2 are located on respective lateral sides (e.g., on left and right sides) of the first detection surface S1.

As illustrated in FIG. 3, the body 12 has a first accommodation recess 121 accommodating the pressure sensitive unit 2 and two second accommodation recesses 122 accommodating the two sensing units 5 on a one-to-one basis. The first accommodation recess 121 and the two second accommodation recesses 122 are aligned along a longitudinal direction of the housing 10 in the order of the second accommodation recess 122, the first accommodation recess 121, and the second accommodation recess 122. In other words, each sensing unit 5 is aligned with the pressure sensitive unit 2 in the housing 10 when viewed from a front side (of the press surface 30) of the pressure sensitive unit 2. In other words, the two sensing units 5 are aligned on respective sides of the pressure sensitive unit 2 such that the pressure sensitive unit 2 is interposed between the two sensing units 5 when viewed from the front side (of the press surface 30) of the pressure sensitive unit 2.

(2.3) Pressure Sensitive Unit

The pressure sensitive unit 2 includes the clicking part 3 and the pressure sensor 4 as described above.

The pressure sensor 4 is a capacitive sensor. The pressure sensor 4 is configured to output an electric signal including a change in electrostatic capacitance between a first electrode 6 (a movable electrode) and a second electrode 7 (a fixed electrode). The pressure sensor 4 is disposed on an opposite side of the clicking part 3 from the press surface 30 (in FIG. 1, under the clicking part 3). Specifically, the pressure sensor 4 includes the first electrode 6, an elastic body 14, insulating sheets (15, 16), and the second electrode 7 as illustrated in FIG. 3. The first electrode 6, the elastic body 14, the insulating sheets (15, 16), and the second electrode 7 are aligned in this order in a direction away from the clicking part 3. That is, the first electrode 6 of the components of the pressure sensor 4 is closest to the clicking part 3.

The first electrode 6 is formed of an electrically conductive member (e.g., a metal plate material) and has a rectangular plate shape. The first electrode 6 has: a hole 61 penetrating its central part in a thickness direction thereof; and one or more (in the example shown in the figure, four) projection members 62. The hole 61 has a substantially circular shape when viewed from a front side of the first electrode 6. The four projection members 62 are disposed around the hole 61 and protrude in a direction toward the clicking part 3. The four projection members 62 are disposed close to respective four corners of the first electrode 6 having a rectangular shape. The four projection members 62 have a flat rectangular plate shape formed by, for example, a drawing process to protrude toward the clicking part 3.

The second electrode 7 is formed of an electrically conductive member (e.g., a metal plate material) and has a substantially rectangular flat plate shape as a whole. However, the second electrode 7 of the present embodiment is divided into two parts. That is, the second electrode 7 includes a first split part 71 and a second split part 72 (see FIG. 3) which face the first electrode 6 (via the elastic body 14 and the insulating sheet 15). The first split part 71 and the second split part 72 are aligned with each other on the substantially same plane.

The first split part 71 has a rectangular plate shape with a semicircular-arc-shaped cut-off at its edge portion facing the second split part 72. The first split part 71 has a terminal 711 at an opposite edge portion from the edge portion facing the second split part 72. The terminal 711 protrudes in a direction generally away from the second split part 72. The terminal 711 protrudes outside the housing 10 through a lead hole formed in a bottom of a first accommodation recess 121 of the body 12 (see FIG. 4). An alignment direction of the first split part 71 and the second split part 72 corresponds to, for example, a width direction (a direction orthogonal to the longitudinal direction and a thickness direction) of the housing 10. Moreover, the alignment direction is orthogonal to an alignment direction of the pressure sensitive unit 2 and the sensing units 5 and the thickness direction of the housing 10.

The first split part 71 is fixed to the body 12 by insert molding or the like, and generally only a surface (in FIG. 3, an upper surface) of the first split part 71 is exposed from a bottom surface of the first accommodation recess 121.

The second split part 72 has substantially the same plate shape as the first split part 71 and has a terminal 721 protruding in a direction generally away from the first split part 71. The terminal 721 protrudes outside the housing 10 through the lead hole formed in the bottom of the first accommodation recess 121 of the body 12 (see FIG. 4).

Note that the second split part 72 has an edge portion having a semicircular-arc-shaped cut-off, and the second split part 72 is different from the first split part 71 in that a tongue part 722 protruding in a direction toward the first split part 71 is provided at the edge portion. In other words, the first split part 71 and the second split part 72, except for the tongue part 722, are plane-symmetrical.

The tongue part 722 is substantially disk-shaped. The location of the tongue part 722 in the thickness direction of the first electrode 6 is different from the location of a body section 723 of the second split part 72. The body section 723 is rectangular. Specifically, the tongue part 722 is bent in a direction slightly toward the clicking part 3 from an edge of the body section 723 and extends to be parallel to a surface of the body section 723. Moreover, the tongue part 722 has a central part provided with a contact 724 slightly protruding toward the clicking part 3 by a drawing process or the like. The contact 724 has a circular shape viewed from a front side of the tongue part 722. The contact 724 is defined such that a surface of the contact 724 is generally located within the hole 61 formed in the first electrode 6. The contact 724 is a part with which a summit part 311 of a dome body 31 (which will be described later) of the clicking part 3 comes into contact (via the insulating sheet 16) (see FIG. 3).

The second split part 72 is fixed to the body 12 by insert molding or the like. Only a surface of the tongue part 722 and the surface (in FIG. 1, an upper surfaces) of the body section 723 are generally exposed from the bottom surface of the first accommodation recess 121.

As described above, dividing the second electrode 7 into two parts, that is, the first split part 71 and the second split part 72 can further improve the sensitivity of the pressure sensitive unit 2. For example, even when the input device 1 receives an operation given by a fingertip (the operation body U1) wearing a glove, the input device 1 is hardly influenced by the glove.

As illustrated in FIG. 3, the elastic body 14 is, for example, in the form of a rectangular sheet. The elastic body 14 is electrically conductive. The elastic body 14 is, for example, an electrically conductive rubber sheet. The elastic body 14 has a hole 140 penetrating its central part in the thickness direction thereof. The hole 140 has a substantially circular shape when viewed from a front side of the elastic body 14. The outer shape of the elastic body 14 is generally the same as the outer shape of the first electrode 6. The thickness of the elastic body 14 is generally the same as the thickness of the first electrode 6. The diameter dimension of the hole 140 is slightly larger than the diameter dimension of the hole 61 formed in the first electrode 6. The elastic body 14 has a first surface 141 (in FIG. 3, an upper surface) disposed to be generally in surface contact with a back surface (in FIG. 3, a lower surface) of the first electrode 6.

As illustrated in FIG. 3, the insulating sheet 15 is, for example, a rectangular sheet-like insulator (dielectric). The insulating sheet 15 has a hole 150 penetrating its central part in the thickness direction thereof. The hole 150 has a substantially circular shape when viewed from a front side of the insulating sheet 15. The outer shape of the insulating sheet 15 is generally the same as the outer shape of the first electrode 6. In the present embodiment, the thickness of the insulating sheet 15 is smaller than the thickness of the first electrode 6. The insulating sheet 15 is disposed to generally cover the surface of the first split part 71 and a surface of the second split part 72 which are exposed from the bottom surface of the first accommodation recess 121. Note that the surface of the tongue part 722 is also covered with the insulating sheet 16. The insulating sheet 16 covering the surface of the tongue part 722 is a circular-shaped insulator (dielectric) separated from the insulating sheet 15 (see FIG. 3) but may be integrated with the insulating sheet 15.

The clicking part 3 has the press surface 30 (in FIG. 3, an upper surface) and is configured to provide a sense of click to the operation body U1 which applies pushing force to the press surface 30. The clicking part 3 is an elastically deformable part. Specifically, the clicking part 3 has a dome plate shape and includes the dome body 31 whose surface is the press surface 30. The dome body 31 is made of an elastic material (e.g., a metal plate). The dome body 31 is a so-called metal dome. The clicking part 3 may further include a flange, a leg, or the like integrated with a peripheral edge of the dome body 31.

The press surface 30 is a convex surface. As illustrated in FIG. 2B, when the press surface 30 receives pushing force, the clicking part 3 elastically deforms, thereby providing a sense of click. More specifically, the elastic deformation inverts the central part of the dome body 31 from a rising state to a depressed state (buckling). Thus, when the press surface 30 receives the pushing force, the clicking part 3 elastically deforms such that the press surface 30 is depressed, thereby providing the sense of click to the operation body U1.

As illustrated in FIG. 3, the dome body 31 has a peripheral portion 310 and the summit part 311. The dome body 31 is disposed above the first electrode 6 of the pressure sensor 4. Specifically, the peripheral portion 310 of the dome body 31 is placed on the four projection members 62, having flat surfaces, of the first electrode 6 (see FIG. 6).

If no projection member 62 were provided, the summit part 311 would come into contact with the edge of the first electrode 6, leading to electrical interference and an impaired sense of click. Providing the projection members 62 can reduce the possibility that the summit part 311 comes into contact with the edge of the hole 61 formed in the first electrode 6 when the dome body 31 whose shape and/or dimension varies case by case buckles. In other words, members relating to the first electrode 6 can be made common without depending on the types of the dome body 31. The projection members 62 relate to the structure of the pressure sensitive unit 2 itself. Thus, the sensing unit 5 is not an essential component for the pressure sensitive unit 2 including the projection members 62.

The dome body 31 pushes the first electrode 6 toward the second electrode 7 by the peripheral portion 310 in accordance with pushing force from the operation body U1. In other words, the first electrode 6 is a movable electrode which is movable, by receiving the pushing force via the dome body 31, in a direction toward the second electrode 7 while pushing the elastic body 14 and the insulating sheet 15. Moreover, when the dome body 31 buckles in accordance with the pushing force from the operation body U1, the summit part 311 passes through the hole 61 formed in the first electrode 6 and approaches the contact 724 of the tongue part 722 of the second electrode 7 and comes into contact with the insulating sheet 16 on the contact 724.

The pusher 13 is a member that facilitates the occurrence of the elastic deformation of the clicking part 3. As illustrated in FIG. 3, the pusher 13 has a disk shape. Moreover, the pusher 13 has an outer shape smaller than the outer shape of the clicking part 3. The pusher 13 is disposed between the summit part 311 of the dome body 31 and the cover 11 (see FIG. 1). The pusher 13 is fixed to the cover 11 or the clicking part 3. The pusher 13 is desirably fixed to the cover 11. The pusher 13 is electrically insulating.

Figure 2A:
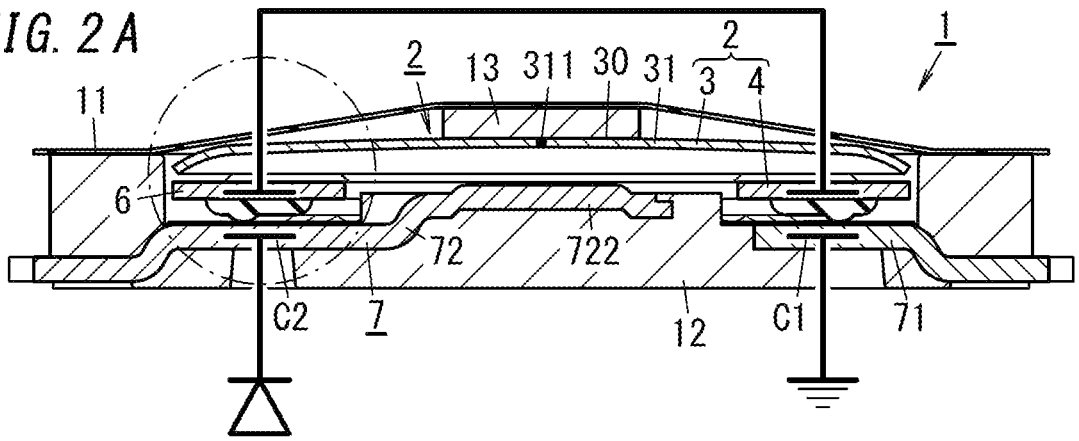
FIG. 2A is a sectional view schematically illustrating the input device.
Figure 2B:
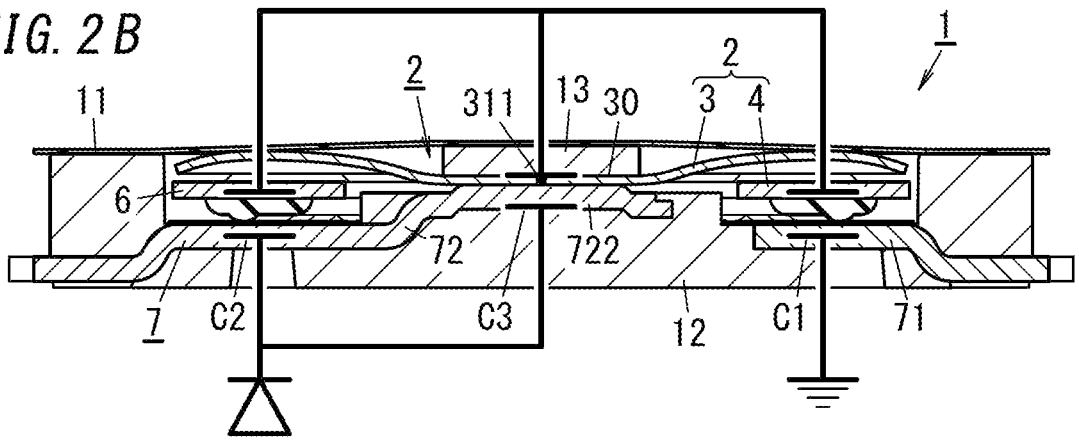
FIG. 2B is a sectional view schematically illustrating the input device with its clicking part being buckled.

FIG. 2A schematically shows a circuit configuration before the central part of the dome body 31 buckles. The first electrode 6 and the first split part 71 of the second electrode 7 may form a capacitor C1. The first electrode 6 and the second split part 72 of the second electrode 7 may form a capacitor C2. The capacitors C1 and C2 are connected in series via the dome body 31 which is electrically conductive.

The operation body U1 touches the first detection surface S1 (or the operation plate T1) of the cover 11 and pushes the clicking part 3, thereby compressing the elastic body 14, which changes the distance and the counter area between the first electrode 6 and the second electrode 7. Thus, electrostatic capacitance of a composite of the capacitors C1 and C2 changes. An analogue electric signal (a first signal) including the change in the electrostatic capacitance can then be output via the terminals 711 and 721 to an outside of the input device 1. Note that the symbol of a diode connected to one electrode of the capacitor C2 in FIG. 2A visually illustrates that the electrostatic charges accumulated in the capacitors C1 and C2 flow only to the ground point side, but this symbol is not intended to indicate the actual existence of the diode.

In contrast, FIG. 2B schematically shows a circuit configuration after the central part of the dome body 31 buckles. The central part of the dome body 31 comes into contact with the tongue part 722 of the second split part 72 of the second electrode 7 (hereinafter referred to as "turning ON" of the contact point in some cases), thereby forming the capacitor C3. The capacitor C1 and the capacitor C3 are connected in parallel. Thus, after the turning ON of the contact point, an analogue electric signal (a first signal) including the change in the electrostatic capacitance of a composite of the capacitors C1 to C3 due to a further additional load can be output via the terminals 711 and 721. Note that the symbol of a diode connected to one electrode of the capacitor C2 in FIG. 2B visually illustrates that the electrostatic charges accumulated in the capacitors C1 to C3 flow only to the ground point side, but this symbol is not intended to indicate the actual existence of the diode.

Figure 2C:
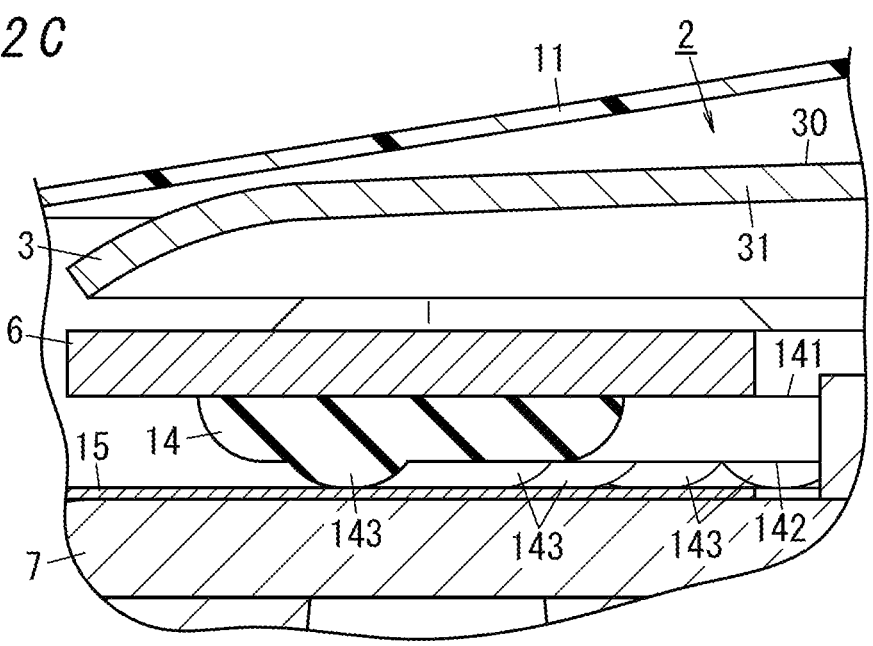
FIG. 2C is an enlarged sectional view illustrating an area circled by a long dashed short dashed line of FIG. 2A.

By the way, the first surface 141 of the elastic body 14 is a flat surface, whereas a second surface 142 at an opposite side of the elastic body 14 from the first surface 141 is an uneven surface (see FIG. 2C). Specifically, the elastic body 14 has a plurality of projections 143 on the second surface 142. The elastic body 14 is disposed on the insulating sheet 15 with the second surface 142 having the plurality of projections 143 facing the insulating sheet 15. Thus, when the elastic body 14 is pushed by the clicking part 3, the plurality of projections 143 are crushed. Thus, the entire thickness of the elastic body 14 decreases, but simultaneously, the contact area between the elastic body 14 and the insulating sheet 15 increases. Thus, the linearity of a change in electrostatic capacitance with respect to pressing force applied to the pressure sensitive unit 2 is simply improved as compared to the case where the thickness of the elastic body 14 changes.

(2.4) Sensing Unit

The two sensing units 5 are capacitive sensors as described above and are disposed on respective sides of the pressure sensitive unit 2 when viewed from the front side of the press surface 30. The sensing units 5 are disposed adjacent to the pressure sensitive unit 2. The two sensing units 5 are assumed to have the same configurations in this embodiment. However, the two sensing units 5 may have different configurations. Each sensing unit 5 is configured to sense that the operation body U1 comes in proximity to or touches a corresponding one of the corresponding second detection surfaces S2 of the cover 11.

As illustrated in FIGS. 3 and 4, each sensing unit 5 includes an electrode 50 and a pair of terminals 51. Each electrode 50 is formed from an electrically conductive member (e.g., a metal plate material) to have a rectangular plate shape. That is, each sensing unit 5 is a self-capacitance sensor which includes a single electrode 50 and which is configured to sense a change in electrostatic capacitance between the electrode 50 and the operation body U1. The terminals 51 in the pair protrude from respective ends in a longitudinal direction of the electrode 50. Specifically, the pair of terminals 51 protrude in a direction away from the cover 11 and extend in a direction apart from each other. Each sensing unit 5 is accommodated in a corresponding one of the second accommodation recess 122 of the body 12. Each sensing unit 5 is fixed to the body 12 by insert molding or the like, and generally only a surface (in FIG. 3, an upper surface) of the electrode 50 is exposed from a top surface 120 (see FIGS. 1 and 3) of the body 12. The surface of the electrode 50 is generally flush with the top surface 120.

Each second detection surface S2 of the cover 11 is an area generally having the same shape as a corresponding one of the surfaces of the electrode 50 and overlying the corresponding one of the surfaces of the electrode 50 when viewed from the front side of the cover 11. The operation body U1 touches the second detection surface S2 (or an operation plate T1) of the cover 11, so that an analog electric signal (the second signal) can be output via the terminals 51. The analog electric signal includes the change in electrostatic capacitance of a capacitor C4 (see FIG. 1) including the electrode 50 and the operation body U1. Note that the symbol of a diode connected to one electrode of the capacitor C4 in FIG. 1 visually illustrates that the electrostatic charges accumulated in the capacitor C4 flow only to the ground point side, but this symbol is not intended to indicate the actual existence of the diode.

By the way, the input device 1 of the present embodiment further includes a pair of wall sections 18 as illustrated in FIG. 1. The pair of wall sections 18 support the pair of sensing units 5 such that the locations of the pair of sensing units 5 in a direction intersecting (here direction substantially orthogonal to) the second detection surface S2 are aligned with the location of the press surface 30. The pair of wall sections 18 are part of the body 12. Each wall section 18 corresponds to a bottom part of a corresponding one of the second accommodation recesses 122. That is, each wall section 18 supports a corresponding one of the sensing units 5 upward from below. When the wall sections 18 are provided in such a manner, the sensing units 5 can be disposed at a location closer to a surface side of the housing 10 in a direction substantially orthogonal to the second detection surfaces S2. Moreover, also when the thickness dimension of the pressure sensitive unit 2 depends on the clicking part 3 or the like and is greater than the thickness dimension of each sensing unit 5, the locations of the sensing units 5 in the direction substantially orthogonal to the second detection surfaces S2 can be aligned with the location of the press surface 30. Thus, the sensitivity of the sensing unit 5 can be suppressed from being reduced.

(2.5) Controller

The controller 9 of the input system 100 may be implemented as, for example, a microcontroller including, as major constituent elements, a central processing unit (CPU) and a memory. That is to say, the controller 9 is implemented as a computer including a CPU and a memory. The computer performs the function of the controller 9 by making the CPU execute a program stored in the memory. In this embodiment, the program is stored in the memory in advance. However, the program may be provided over a telecommunications network such as the Internet, or as a recording medium such as a memory card storing the program therein.

The controller 9 is electrically connected to the input device 1. As illustrated in FIG. 5, the controller 9 includes the first acquirer 91, the second acquirer 92, the determiner 93, and other components. In other words, the controller 9 has a function as the first acquirer 91, a function as the second acquirer 92, a function as the determiner 93, and other functions.

The first acquirer 91 is configured to acquire the first signal output from the pressure sensor 4 of the pressure sensitive unit 2. The second acquirer 92 is configured to individually acquire the second signals output from the respective two sensing units 5. The determiner 93 is configured to determine the operational state of the operation body U1 in accordance with the first signal and the second signal acquired from the input device 1.

Electrostatic capacitances of the pressure sensor 4 of the pressure sensitive unit 2 and the two sensing units 5 can be acquired by various methods, and, for example, a switched capacitor system may be adopted. In the switched capacitor system, (changes in) the electrostatic capacitances of the pressure sensor 4 of the pressure sensitive unit 2 and the two sensing units 5 are detected based on the amount of electric charges accumulated in the capacitors C1 to C4. The controller 9 alternately performs a charge and a discharge process repeatedly on the capacitors in a sequential order based on, for example, the switched capacitor system, for a predetermined time. The charge process is a process of charging the capacitor. The discharge process is a process of discharging the capacitor to charge a capacitor for determination with the accumulated electric charges. When a voltage across the capacitor for determination reaches a specified value, the discharge process is ended, and the charge process is started. That is, as the electrostatic capacitance increases, the number of times that the voltage across the capacitor for the determination reaches the specified value within a predetermined time increases. Thus, the controller 9 can determine a change in the electrostatic capacitance based on the number of times that the voltage across the capacitor for the determination reaches the specified value within the predetermined time.

Here, the determiner 93 of the present embodiment determines various operational states (operation inputs) of the operation body U1 based on combinations of sensing results relating to the changes in the electrostatic capacitances of the pressure sensitive unit 2 and the two sensing units 5. The sensing results may include, for example, touching, pushing, and clicking the pressure sensitive unit 2 and touching each sensing unit 5. The pushing of the pressure sensitive unit 2 means application of a load which is larger (which causes a greater change in the electrostatic capacitance) than that in the case of the touching but which is smaller than that in the case of the clicking so that the contact point is not turned ON.

Here, the operational state of the present embodiment includes directionality relating to movement of the operation body U1 to the pressure sensitive unit 2. Moreover, the operational state of the present embodiment includes a mode relating to at least one process of a first operation process or a second operation process. The first operation process is an operation process in which the operation body U1 comes close to the press surface 30 and gives pushing force (touches, pushes, or clicks) the press surface 30. The second operation process is an operation process in which the operation body U1 moves away from the press surface 30 after the operation body U1 gives the pushing force to the press surface 30.

Specifically, the operational state includes seven operational states described below. The following operational states are mere examples and should not be construed as limiting. The determiner 93 may be configured to determine one or more operational states of the following seven operational states. For example, the determiner 93 may be set to determine only whether or not the operational state of the operation body U1 is the second operational state, or may be set to determine whether the operational state of the operation body U1 is the second operational state or the third operational state.

Figure 7A:
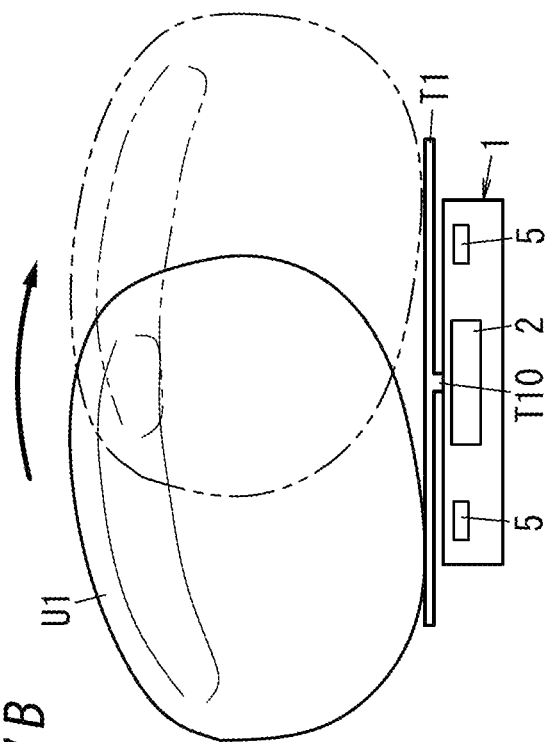
FIGS. 7A to 7D are views schematically illustrating operational states of an operation body to the input device.

As illustrated in FIG. 7A, the first operational state includes a series of operational states in which the operation body U1 touches the two sensing units 5 substantially at the same time via the operation plate T1 and clicks the pressure sensitive unit 2. Note that the operation plate T1 has a back surface provided with a projection T10, and the projection T10 applies pushing force to the first detection surface S1.

Figure 7B:
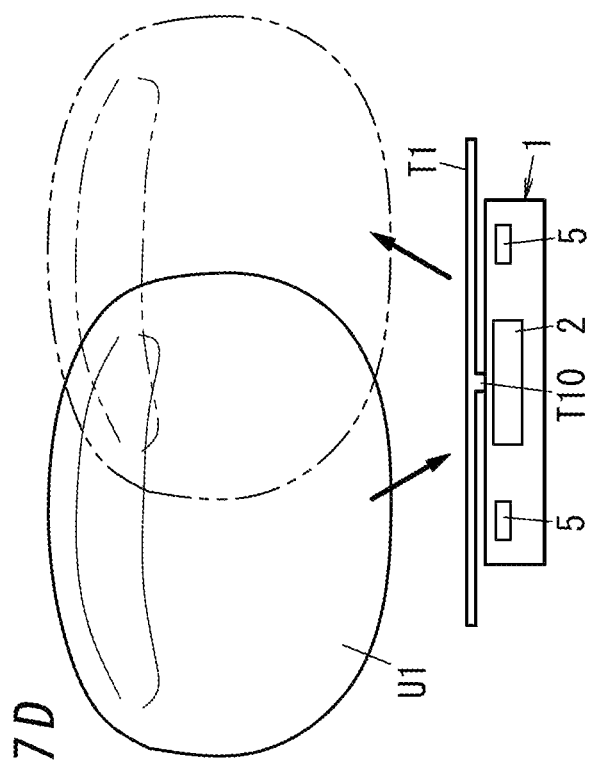

As illustrated in FIG. 7B, the second operational state includes a series of operational states in which the operation body U1 touches the left sensing unit 5 at first via the operation plate T1 and then clicks the pressure sensitive unit 2, and the operation body U1 further moves to draw an arc to the right and touches the right sensing unit 5. Note that as the operation body U1 moves to draw an arc, the operation plate T1 also slightly turns to draw an arc with the projection T10 serving as a supporting point.

In contrast to the second operational state, the third operational state includes a series of operational states in which the operation body U1 moves to draw an arc from the right sensing unit 5 and touches the left sensing unit 5 via the operation plate T1.

Figure 7C:
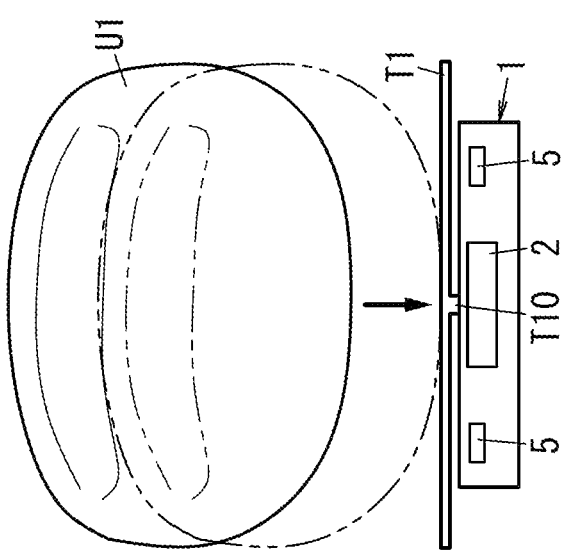

As illustrated in FIG. 7C, the fourth operational state includes a series of operational states in which the operation body U1 moves in a substantially sliding manner from the left sensing unit 5 via the operation plate T1 to the pressure sensitive unit 2 and then to the right sensing unit 5. In sum, the fourth operational state is an operational state in which the operation body U1 only performs touch (or push) movement without giving a click operation to the pressure sensitive unit 2.

In contrast to the fourth operational state, the fifth operational state includes a series of operational state in which the operation body U1 moves in a substantially sliding manner from the right sensing unit 5 via the operation plate T1 to the left sensing unit 5.

In sum, the determiner 93 not only determines the type of the (touching, pushing, or clicking) operation given to the pressure sensitive unit 2 but also determines directionality (the order of operations) relating to a direction (in the example shown in the figure, right, left, or above) from which the pressure sensitive unit 2 receives an operation and a direction in which the operation body U1 moves away. Then, the controller 9 can transmit a control signal according to the type of the operation and the directionality relating to the movement of the operation body U1 to another circuit module or the like. The determiner 93 having such a configuration enables processes corresponding to various types of operational states to be performed.

Moreover, the determiner 93 may be able to perform a proximity determination by adjusting a specified value or the like such that sensitivity for determining the touching each sensing unit 5 described above is increased. The following sixth and seventh operational states are examples of operational states relating to the proximity determination.

Figure 7D:
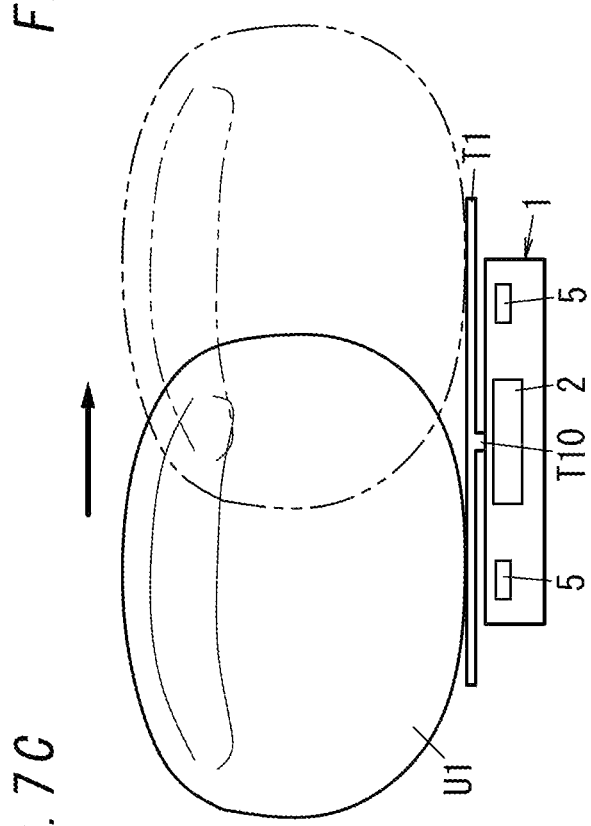

As illustrated in FIG. 7D, the sixth operational state includes a series of operational states (a hover operation) in which the operation body U1 obliquely comes in proximity to the pressure sensitive unit 2 from above the left sensing unit 5, clicks the pressure sensitive unit 2 via the operation plate T1, and then moves above the right sensing unit 5. In sum, the sixth operational state is an operational state in which the operation body U1 draws a substantially V shape.

In contrast to the sixth operational state, the seventh operational state includes a series of operational states in which the operation body U1 comes in proximity to the pressure sensitive unit 2 from above the right sensing unit 5, clicks the pressure sensitive unit 2 via the operation plate T1, and then moves above the left sensing unit 5.

In sum, in the sixth and seventh operational states, the determiner 93 determines from which of sides of the left and right sensing units 5 the operation body U1 approaches to the pressure sensitive unit 2 and to which of sides of the left and right sensing units 5 the operation body U1 moves away from the pressure sensitive unit 2, rather than which of the left sensing unit 5 or the right sensing unit 5 is touched. The determiner 93 having such a configuration enables processes corresponding to more various types of operational states to be performed.

Note that the operational state does not have to include the directionality relating to the movement of the operation body U1. The operational state may simply be an operational state including a relative location of the operation body U1 (which may be the tilt of the operation body U1). The following eighth and ninth operational states are examples of operational states relating to a relative location determination of the operation body U1.

The eighth operational state is an operational state in which the operation body U1 is tilted to the left, and in this state, the operation body U1 is located at the left sensing unit 5 and the pressure sensitive unit 2.

In contrast to the eighth operational state, the ninth operational state is an operational state in which the operation body U1 is tilted to the right, and in this state, the operation body U1 is located at the right sensing unit 5 and the pressure sensitive unit 2.

In sum, with regard to the eighth and ninth operational states, the determiner 93 determines to which of the left sensing unit 5 or on the right the operation body U1 is shifted when the operation body U1 applies the pushing force to the pressure sensitive unit 2.

Note that FIGS. 7A to 7D are side views schematically illustrating the input device 1. It is assumed in FIGS. 7A to 7D, for example, that the input device 1 has a lateral size slightly smaller than the width of a fingertip of a person (the operation body U1). The lateral dimension of the input device 1 is, for example, 9 mm. However, the dimension is not limited to this example.

(2.6) Operation

Operation of the input device 1 will be briefly described below.

First, an example in which the operation body U1 pushes the clicking part 3 of the pressure sensitive unit 2 will be described. The pressure sensor 4 supports the clicking part 3, and the pressure sensor 4 receives pressure when the operation body U1 pushes a center part (the summit part 311 and therearound) of the press surface 30 of the clicking part 3. Thus, as the amount of depression (stroke) of the clicking part 3 increases, the electrostatic capacitance of the pressure sensor 4 (the capacitors C1 and C2) increases. When the amount of depression (stroke) of the clicking part 3 increases and reaches a prescribed value, the dome body 31 of the clicking part 3 elastically deforms, thereby providing a sense of click. When the dome body 31 elastically deforms, the dome body 31 comes into contact with the insulating sheet 16 on the contact 724 of the second electrode 7, which can form the capacitor C3. That is, the distance between the summit part 311 of the clicking part 3 and the second electrode 7 is significantly changed, and such a significant change in distance results in a significant change in the electrostatic capacitance of the pressure sensor 4. Further application of an additional load even after the contact point is turned ON results in a significant change in overall composite electrostatic capacitance, inclusively of the capacitor C3.

Next, an example in which the operation body U1 comes into contact with (touches) either of the sensing units 5 will be described. Each sensing unit 5 is disposed on a back side of the cover 11 to generally overlap a corresponding one of the second detection surfaces S2 when viewed from the front side of the cover 11. The operation body U1 is, for example, an object, such as a hand finger of a person, having a ground potential, and in this case, when the operation body U1 comes into contact with (touches) the second detection surface S2 directly or via the operation plate T1, a pseudo capacitor C4 is formed as illustrated in FIG. 1. This results in a change in the electrostatic capacitance of the sensing unit 5 (the capacitor C4).

The controller 9 monitors changes in the electrostatic capacitances of the pressure sensitive unit 2 and each sensing unit 5 to determine an operational state to which the input given to the input device 1 corresponds, and the controller 9 outputs a control signal corresponding to the operational state to an external component (e.g., another circuit module).

(2.7) Usage

Usage of the input device 1 will be described below.

According to the input device 1, the directionality relating to movement of the operation body U1 with the pressure sensitive unit 2 as the center and the relative location (tilt) of the operation body U1 can be determined based on a balance of the changes in the electrostatic capacitances of the pressure sensitive unit 2 and the pair of sensing units 5. The balance of the changes in the electrostatic capacitances is evaluated based on, for example, the magnitude relationship of the changes in the electrostatic capacitances of the pair of sensing units 5 on respective sides of the pressure sensitive unit 2.

Moreover, according to the input device 1, the magnitude of pushing force to (the amount of depression of) the pressure sensitive unit 2 can be determined in addition to the directionality relating to the movement of the operation body U1 and the relative location of the operation body U1. If the change in the electrostatic capacitance of the pressure sensitive unit 2 is large, the amount of depression is assumed to be large.

Moreover, whether or not the clicking part 3 elastically deforms (whether or not a sense of click is provided) may be determined based on the change in the electrostatic capacitance of the pressure sensitive unit 2.

In addition, the pressure sensitive unit 2 and the sensing units 5, which are independent of and aligned with each other in the present embodiment, enables various types of operations to be handled while reducing inhibitions against provision of a sense of click at the pressure sensitive unit 2.

Moreover, since the pressure sensor 4 is a capacitive sensor, an input device 1 having higher sensitivity can be provided than in the case of, for example, an optical sensor, an inductive sensor, or a magnetic sensor. In particular, even in the case of the input device 1 having a dimension substantially as large as the width of a fingertip of a person, an input device 1 having a further increased accuracy can be provided. Similarly, each sensing unit 5 is also a capacitive sensor, and therefore, an input device 1 having high sensitivity can be provided. In particular, in the present embodiment, the pressure sensor 4 and each sensing unit 5 are all capacitive sensors, and therefore, signals output from the pressure sensor 4 and each sensing unit 5 can be processed by one common controller 9. In sum, the controller can be made common.

Moreover, according to the input device 1, the pressure sensitive unit 2 and the pair of sensing units 5 are independently of one another and are respectively accommodated in the first accommodation recess 121 and the pair of second accommodation recesses 122 of the housing 10. Thus, for example, the input device 1 also has an excellent waterproof property as compared to the case where the sensing units 5 are also accommodated in the first accommodation recess 121 of the pressure sensitive unit 2.

(3) Variation

The embodiment described above is a mere example of various embodiments of the present disclosure. Rather, the embodiment described above may be readily modified in various manners depending on a design choice or any other factor without departing from the scope of the present disclosure. Moreover, functions similar to those of the input system 100 according to the embodiment described above may be embodied by a control method, a computer program, a non-transitory storage medium storing a computer program, or the like of the input system 100.

Next, variations of the embodiment described above will be enumerated one after another. The variations described below are applicable accordingly in combination. In the following description, the embodiment described above will be referred to as a "basic example".

The controller 9 of the input system 100 of the present disclosure includes a computer system. The computer system includes, as principal hardware components, a processor and a memory. The processor executes a program stored in the memory of the computer system, thereby implementing functions as the controller 9 of the input system 100 in the present disclosure. The program may be stored in the memory of the computer system in advance, may be provided over a telecommunications network, or may be provided as a non-transitory recording medium such as a computer system-readable memory card, optical disc, or hard disk drive storing the program. The processor of the computer system may be made up of a single or a plurality of electronic circuits including a semiconductor integrated circuit (IC) or a largescale integrated circuit (LSI). The integrated circuit such as IC or LSI mentioned herein may be referred to in another way, depending on the degree of the integration and includes integrated circuits called system LSI, very-large-scale integration (VLSI), or ultra-large-scale integration (ULSI). A field-programmable gate array (FPGA), which is programmable after fabrication of the LSI, or a logical device which allows reconfiguration of connections in LSI or reconfiguration of circuit cells in LSI may be adopted as the processor. The plurality of electronic circuits may be collected on one chip or may be distributed on a plurality of chips. The plurality of chips may be collected in one device or may be distributed in a plurality of devices. As mentioned herein, the computer system includes a microcontroller including one or more processors and one or more memories. Thus, the microcontroller is also composed of one or more electronic circuits including a semiconductor integrated circuit or a large-scale integrated circuit.

Moreover, collecting the plurality of functions of the controller 9 of the input system 100 in one housing is not an essential configuration of the input system 100. The components of the input system 100 may be distributed in a plurality of housings. Moreover, at least some functions of the input system 100, for example, some functions of the input system 100, may be implemented by cloud (cloud computing) or the like. Conversely, a plurality of functions of the input system 100 may be collected in a single housing as in the basic example.

(3.1) First Variation

An input device 1 of the present variation (a first variation) will be described below with reference to FIGS. 8A to 9. Note that components common to those of the basic example may be denoted by the same reference signs as those in the basic example, and the description thereof will be accordingly omitted.

Figure 8A:
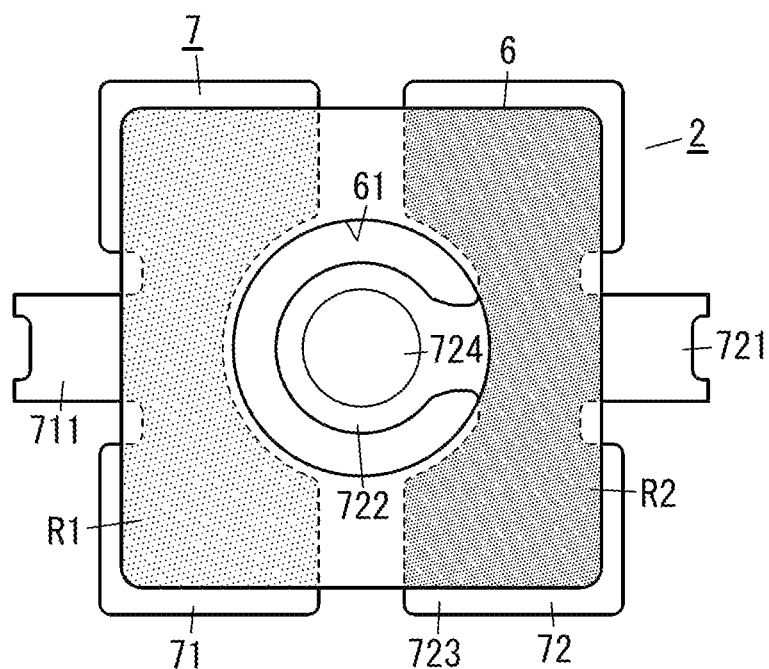
FIG. 8A is a schematic plan view of a main part illustrating a second electrode of the input device.

For convenience of explanation, FIG. 8A shows only the first electrode 6 and the second electrode 7 (the first split part 71 and the second split part 72) of the pressure sensitive unit 2 of the input device 1 of the basic example. FIG. 8A is a view seen from the front side in the thickness direction of the first electrode 6 (in other words, the front side of the press surface 30), where a region in which the first electrode 6 and the second electrode 7 overlap each other is hatched with dots. In FIG. 8A, a first region R1 is a region in which the first electrode 6 and the first split part 71 overlap each other, and a second region R2 is a region in which the first electrode 6 and the second split part 72 overlap each other.

Figure 8B:
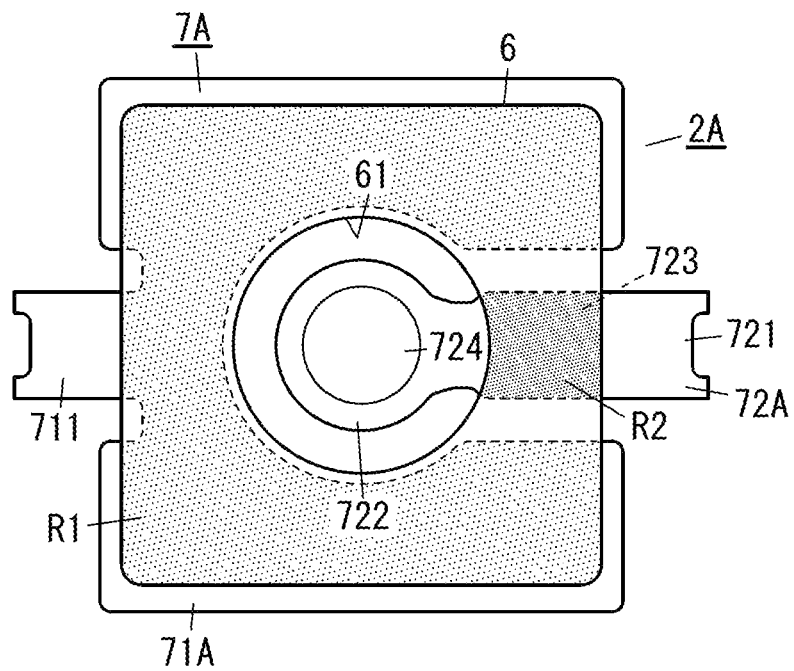
FIG. 8B is a schematic plan view of a main part illustrating a second electrode of a first variation of the input device.

In contrast, FIG. 8B shows only a first electrode 6 and a second electrode 7A (a first split part 71A and a second split part 72A) of a pressure sensitive unit 2A of an input device 1 of the first variation. FIG. 8B is a view seen from the front side in the thickness direction of the first electrode 6, where a region in which the first electrode 6 and the second electrode 7A overlap each other is hatched with dots. In FIG. 8B, a first region R1 is a region in which the first electrode 6 and the first split part 71A overlap each other, and a second region R2 is a region in which the first electrode 6 and the second split part 72A overlap each other.

In the basic example, the first split part 71 and the second split part 72 are defined such that the area of the first region R1 and the area of the second region R2 are generally "even" therebetween. In contrast, in the first variation, the first split part 71A and the second split part 72A are defined such that the area of the first region R1 and the area of the second region R2 are "uneven" unlike the basic example.

In this variation, for example, the first split part 71A except for a terminal 711 has a substantially U-plate shape. A tongue part 722, a contact 724, and a terminal 721 of the second split part 72A have the same structures as those in the basic example. A body section 723 of the second split part 72A is configured to be within an open space in a U-shaped part of the first split part 71A without coming into contact with the first split part 71A.

Figure 9:
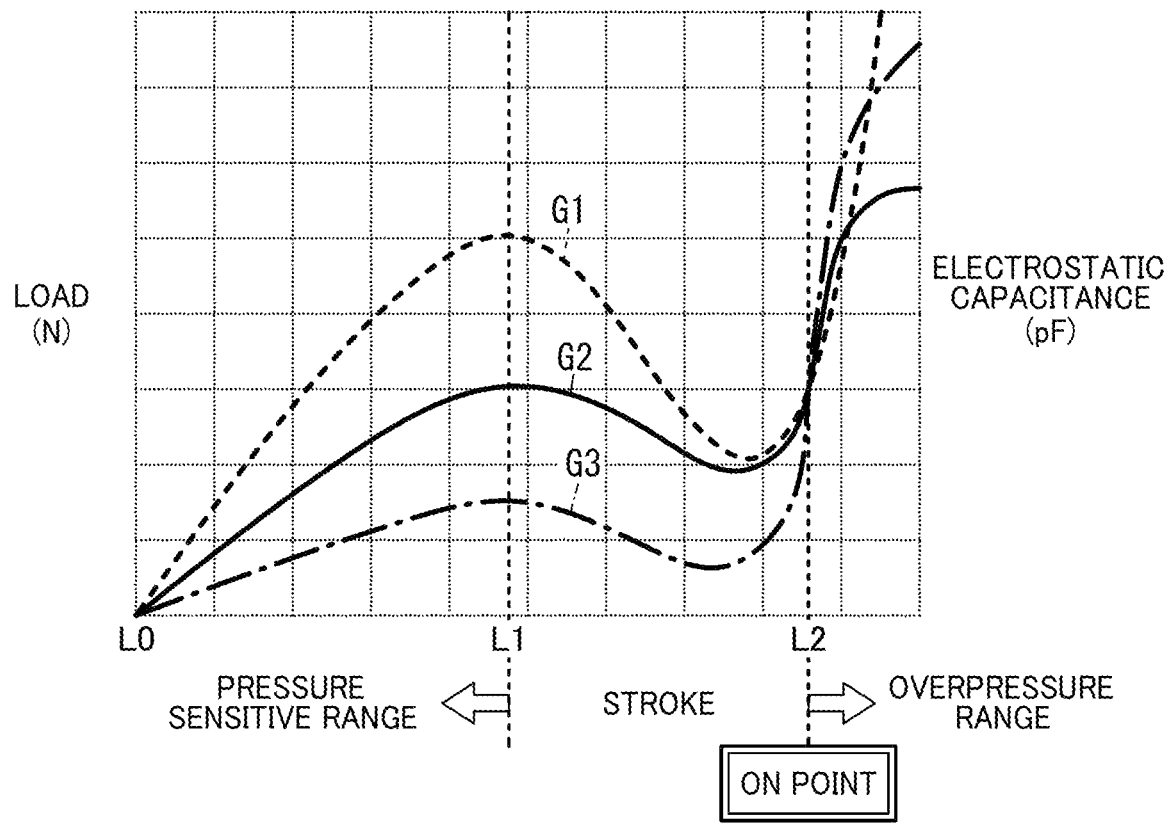
FIG. 9 is a graph illustrating characteristics relating to electrostatic capacitances of the input device and the first variation.

FIG. 9 is a graph illustrating characteristics relating to electrostatic capacitance of the input device 1 of the basic example and the input device 1 of the first variation. A characteristic G1 indicated by a dotted line shows a characteristic of a load [N] (ordinate on the left) with respect to the stroke [μm] (the amount of depression of the clicking part 3: abscissa) and is shown as a reference. The characteristic G1 is generally common to the input device 1 of the basic example and the input device 1 of the first variation. A characteristic G2 indicated by a solid line shows a characteristic of electrostatic capacitance [pF] (ordinate on the right) with respect to the stroke [μm] when the area of the first region R1 and the area of the second region R2 are generally "even" therebetween as in the case of the input device 1 of the basic example. A characteristic G3 indicated by a long dashed short-dashed line shows a characteristic of electrostatic capacitance [pF] (ordinate on the right) with respect to the stroke [μm] when the area of the first region R1 and the area of the second region R2 are "uneven" as in the case of the input device 1 of the variation.

In the example shown in FIG. 9, at a time point at which the stroke of the clicking part 3 reaches L1 from L0, the central part of the dome body 31 of the clicking part 3 is inverted from a rising state to a depressed state. Within a range (pressure sensitive range) in which the stroke is from L0 to L1, the characteristics G1 to G3 gradually increase to draw a gentle curve. The central part of the dome body 31 is depressed, and the clicking part 3 is further pushed, and at a time point at which the stroke reaches L2, the central part of the dome body 31 comes into contact with the contact 724 of the second electrode 7 via an insulating sheet 16 (turning ON of the contact point). In a range from L1 to L2 of the stroke, the characteristics G1 to G3 gradually decrease and start increasing again immediately before L2. In a range (an overpressure range) after the stroke is L2, the characteristics G1 to G3 rapidly increase.

Here, Table 1 below shows the magnitude relationship in "evenness" and "unevenness" which can be seen from FIG. 9 for three items, namely, "the sensitivity in the pressure sensitive range", "tilt at an ON point", and "the sensitivity in the overpressure range".

TABLE 1

|  | Evenness | Unevenness |
| --- | --- | --- |
| Sensitivity in Pressure Sensitive Range | High | Low |
| Tilt at ON Point | Low | High |
| Sensitivity in Overpressure Sensitive Range | Low | High |

In terms of the sensitivity in the pressure sensitive range, a change in electrostatic capacitance is larger and the sensitivity is higher (higher reliability) in the characteristic G2 corresponding to "evenness" than in the characteristic G3 corresponding to "unevenness" even when the stroke is the same, and therefore, a dome body 31 which a relatively light operation force suffice is selectable in the basic example.

In terms of the tilt at the ON point, the characteristic G3 corresponding to "unevenness" is larger than the characteristic G2 corresponding to "evenness", and therefore, the detection accuracy is more improved and the shift of the ON point is more reduced in the first variation than in the basic example.

In terms of the sensitivity of the overpressure range, a change in the electrostatic capacitance is larger and the sensitivity is higher (higher reliability) in the characteristic G3 corresponding to "unevenness" than in the characteristic G2 corresponding to "evenness" even when the stroke is the same, and therefore, a signal regarding an overstroke can also be output.

With the configuration of a first variation, the second electrode 7 is divided into two parts, that is, the first split part 71 and the second split part 72, in a similar manner to the basic example, and therefore, the configuration of the first variation can further improve the sensitivity of the pressure sensitive unit 2. For example, even when the input device 1 receives an operation given by a fingertip (the operation body U1) wearing a glove, the input device 1 is hardly influenced by the glove.

Unlike the basic example, the area of the first region R1 and the area of the second region R2 according to the configuration of a first variation are uneven therebetween, and therefore, the configuration of a first variation is excellent in the sensitivity of the pressure sensitive unit 2 in the overpressure range. Note that regarding the unevenness, the ratio between the area of the first region R1 and the area of the second region R2 is not particularly limited, but the area of the first region R1 is desirably, for example, two or more times as large as the area of the second region R2.

By the way, the "unevenness" between the first split part 71 and the second split part 72 in the first variation relates to the structure of the pressure sensitive unit 2 itself. Thus, for the input device 1 of the first variation, a sensing unit 5 is not an essential component. That is, the input device 1 of the first variation does not have to include the sensing unit 5.

(3.2) Second Variation

Figure 10:
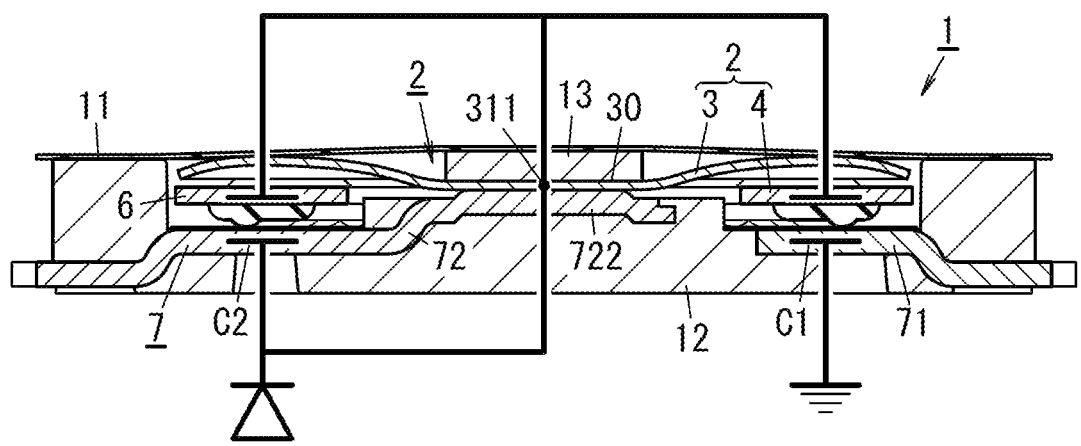
FIG. 10 is a sectional view schematically illustrating a second variation of the input device.

An input device 1 of the present variation (a second variation) will be described below with reference to FIGS. 2B, 3, and 10. Note that components common to those of the basic example may be denoted by the same reference signs as those in the basic example, and the description thereof will be accordingly omitted.

In the basic example, the insulating sheet 16 covering the surface of the tongue part 722 of the second electrode 7 is provided as illustrated in FIG. 3. In the basic example, when the amount of depression of the clicking part 3 increases and reaches a prescribed value, the dome body 31 of the clicking part 3 elastically deforms, thereby providing a sense of click. When the dome body 31 elastically deforms, the summit part 311 of the dome body 31 comes into contact with the insulating sheet 16, which can form the capacitor C3 (see FIG. 2B).

In contrast, the second variation is different from the basic example in that the insulating sheet 16 is not provided. Note that an insulating sheet 15 is provided in a similar manner to the basic example. Since the second variation includes no insulating sheet 16, a summit part 311 directly comes into contact with a contact 724 of a tongue part 722 when a dome body 31 elastically deforms. Thus, a circuit configuration schematically illustrated in FIG. 10 has no capacitor C3 unlike the circuit configuration of the basic example schematically illustrated in FIG. 2B. Note that the symbol of a diode connected to one electrode of the capacitor C2 in FIG. 10 visually illustrates that the electrostatic charges accumulated in the capacitors C1 and C2 flow only to the ground point side, but this symbol is not intended to indicate the actual existence of the diode.

The following description explains a change, resulting from the presence or absence of the insulating sheet 16, in electrostatic capacitance when a click is performed.

First, in the basic example, the electrostatic capacitance of the capacitor C1 is defined as $C_A$, the electrostatic capacitance of the capacitor C2 is defined as $C_B$, the electrostatic capacitance of the capacitor C3 is defined as $C_C$. In this case, composite capacitance $C_D$ of the capacitors C1 to C3 is represented by $C_D=C_A\times(C_B+C_C)/(C_A+C_B+C_C)$ because the capacitors C2 and C3 are parallel to each other.

Here, for convenience of explanation, the electrostatic capacitance $C_A$, the electrostatic capacitance $C_B$, and the electrostatic capacitance $C_C$ are assumed to be equal to one another (i.e., $C_A=C_B=C_C$). In the basic example including the insulating sheet 16, the electrostatic capacitance $C_C$ is zero before a click is performed, and therefore, the composite capacitance $C_D$ is ½ times the electrostatic capacitance $C_A$ of the capacitor C1, and after the click is performed, the composite capacitance $C_D$ is ⅔ of the electrostatic capacitance $C_A$ of the capacitor C1.

In contrast, in the second variation including no insulating sheet 16, the composite capacitance $C_D$ before the click is performed is ½ times the electrostatic capacitance $C_A$ of the capacitor C1 in a similar manner to the basic example. However, after the click is performed the dome body 31 and the tongue part 722 of the second electrode 7 are in a conduction state, which results in a circuit including only the capacitor C1, and as a result, the composite capacitance $C_D$ is one time the electrostatic capacitance $C_A$ of the capacitor C1.

That is, the change in the composite capacitance $C_D$ before and after the click is performed is ⅙ times the electrostatic capacitance $C_A$ in the basic example, whereas in the second variation, the change is ½ times the electrostatic capacitance $C_A$ of the electrostatic capacitance $C_A$. That is, the change in the composite capacitance $C_D$ of the second variation is larger than the change in the composite capacitance $C_D$ of the basic example. Thus, in the second variation including no insulating sheet 16, the change in the composite capacitance $C_D$ when the click is performed is steeper than in the basic example. Thus, in the second variation, a time difference between a timing at which a sense of click is actually provided and a timing at which the controller 9 determines the click can be more reduced than in the basic example.

By the way, the composite capacitance $C_D$ is dominant over a smaller one of the electrostatic capacitance $C_A$ or the electrostatic capacitance $C_B$. Therefore, for example, as the electrode of the capacitor C1 enlarges and the electrode of the capacitor C2 downsizes (in terms of the first variation, the area of the first region R1 increases and the area of the second region R2 decreases), the difference, resulting from the presence or absence of the insulating sheet 16, in the composite capacitance $C_D$ increases. In sum, the time difference described above can be smaller in the combination of the first variation and the second variation than in the basic example.

(3.3) Other Variations

In the basic example, the insulating sheet 15 is disposed between the elastic body 14 and the second electrode 7, which makes easy the step of stacking the insulating sheet 15 on the second electrode 7 (lamination of the second electrode 7 with the insulating sheet 15). However, this should not be construed as limiting. For example, the elastic body 14 and the insulating sheet 15 may be exchanged, and the elastic body 14 may be disposed between the insulating sheet 15 and the second electrode 7. In this case, molding of the elastic body 14 to the second electrode 7 becomes easy.

In the basic example, the insulating sheet 15 is a component separated from the body 12, is a single sheet-like member, and is disposed between other two members which are the elastic body 14 and the second electrode 7. However, the insulating sheet 15 may be integrated with the body 12. Specifically, the body 12 may have a top wall which faces the elastic body 14 and which is a thin film wall molded to cover the entire surface of the second electrode 7, and the thin film wall may correspond to the insulating sheet.

The basic example includes two sensing units 5, and the two sensing units 5 are disposed on left and right sides of the pressure sensitive unit 2. However, the number of the sensing units 5 may be one, or three or more. Alternatively, the two sensing units 5 may be disposed on both sides in a depth direction (forward and rearward direction) of the pressure sensitive unit 2, or three or more sensing units 5 may be disposed to surround the pressure sensitive unit 2. Alternatively, one or two sensing units 5 may be formed in a C-shape to surround the pressure sensitive unit 2 when viewed from the front side of the press surface 30.

When the number of sensing units 5 is one, the input system 100 may be configured to determine a direction from the sensing unit 5 toward the pressure sensitive unit 2, a direction from an exterior of the sensing coverage of the sensing unit 5 toward the pressure sensitive unit 2, a direction from the pressure sensitive unit 2 toward the sensing unit 5, and a direction from the pressure sensitive unit 2 to the exterior of the sensing coverage of the sensing unit 5. In the direction from the exterior of the sensing coverage of the sensing unit 5 toward the pressure sensitive unit 2, for example, if the pressure sensitive unit 2 detects a click with nothing being detected by the sensing unit 5, the input system 100 may determine that the operation body U1 moves from the exterior of the sensing coverage of the sensing unit 5 toward the pressure sensitive unit 2. In the direction from the pressure sensitive unit 2 toward the exterior of the sensing coverage of the sensing unit 5, for example, if nothing is detected by the sensing unit 5 even after a predetermined time has elapsed since the pressure sensitive unit 2 detected a click, the input system 100 may determine that the operation body U1 moves from the pressure sensitive unit 2 toward the exterior of the range of the sensing unit 5.

In the basic example, the input system 100 includes one input device 1 but may include a plurality of input devices 1. The plurality of input devices 1 may be arranged at prescribed intervals in an array. In this case, each input device 1 may have a different number of sensing units 5.

Figure 11A:
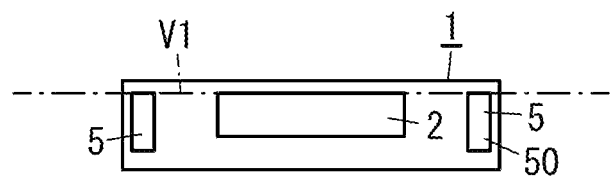
FIG. 11A is a view schematically illustrating a variation of a sensing unit of the input device.

In the basic example, the electrode 50 of the sensing unit 5 has a rectangular plate shape, and a surface of the electrode 50 is generally on the same plane as a surface (a press surface 30 of the clicking part 3) of the pressure sensitive unit 2. However, for example, the electrode 50 of the sensing unit 5 may be disposed as illustrated in FIG. 11A such that a surface of the electrode 50 intersects (in the example shown in the figure, is orthogonal to) a virtual plane V1 parallel to the surface of the pressure sensitive unit 2. FIG. 11A is a side view schematically illustrating the input device 1.

Figure 11B:
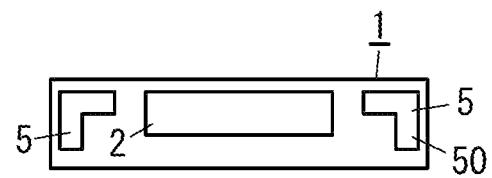
FIG. 11B is a diagram schematically illustrating another variation of the sensing unit of the input device.

Alternatively, as illustrated in FIG. 11B, the variation of FIG. 11A and the basic example may be combined with each other such that the electrode 50 of the sensing unit 5 has a substantially L-shape. FIG. 11B is a side view schematically illustrating the input device 1. In the examples shown in FIGS. 11A and 11B, directionality relating to movement of the operation body U1 with respect to a side surface of the housing 10 of the input device 1 becomes detectable. For example, an operational state in which a fingertip (the operation body U1) is moved from the left side surface along the upper surface of the housing 10 to click the pressure sensitive unit 2 becomes also detectable. In particular, according to the configuration of FIG. 11B, the area of a detection surface of the sensing unit 5 can be increased without changing the overall size of the input device 1. In this case, an operational state in which the input device 1 is "pinched" from left and right sides with an index finger and a thumb each corresponding to the operation body U1 can also be handled.

In the basic example, the operation plate T1 is disposed on the input device 1, and an operation input is given to the input device 1 via the operation plate T1. However, the operation plate T1 does not have to be disposed, and the operation input to the input device 1 may be directly given to the cover 11.

The input device 1 in the basic example is a molded product in which the sensing unit 5 and the second electrode 7 are fixed to the housing 10 by insert molding. However, the entirety of the input device 1 may be formed from, for example, a multilayer substrate. For example, the input device 1 may be formed by: forming the second electrode 7 and the electrode 50 of the sensing unit 5 on a printed circuit board at a lower layer side by conductor patterning (e.g., copper foil patterning); and combining a printed circuit board at an upper layer side with the printed circuit board at the lower layer side. In this case, a layer made of a high-dielectric material is provided on each electrode.

In the basic example, an insulating elastic body which is electrically insulating may be provided in place of the elastic body 14 (conductive elastic body). In this case, the insulating elastic body preferably has relatively high permittivity as in the case of for example, dielectric elastomer. When the insulating elastic body is provided in place of the conductive elastic body, the insulating sheet 15 may be omitted.

(4) Summary

As described above, an input device (1) of a first aspect includes a pressure sensitive unit (2, 2A) and a sensing unit (5). The pressure sensitive unit (2, 2A) includes a clicking part (3) and a pressure sensor (4). The clicking part (3) has a press surface (30) and is configured to provide a sense of click to an operation body (U1) which applies pushing force to the press surface (30). The pressure sensor (4) is disposed on an opposite side of the clicking part (3) from the press surface (30). The sensing unit (5) is aligned with the pressure sensitive unit (2, 2A) when viewed from a front side of the press surface (30) and is configured to sense that the operation body (U1) comes in proximity to or touches a detection surface (a second detection surface S2). With the first aspect, the pressure sensitive unit (2, 2A) and the sensing unit (5) aligned with each other enables various types of operations to be handled while reducing inhibitions against provision of a sense of click. The various types of operations are, for example, an operation of applying pushing force to the pressure sensitive unit (2, 2A) at a location shifted to the sensing unit (5), an operation of applying pushing force to the pressure sensitive unit (2, 2A) at a location apart from the sensing unit (5), and an operation of the operation body (U1) coming in proximity to the pressure sensitive unit (2, 2A) from a side of the sensing unit (5).

In an input device (1) of a second aspect referring to the first aspect, the pressure sensor (4) is preferably a capacitive sensor. The second aspect enables the input device (1) to have higher sensitivity than in the case where the pressure sensor (4) is, for example, an optical sensor, an inductive sensor, or a magnetic sensor. In particular, even when the dimension of the input device (1) is substantially as large as the width of a fingertip of a person, the input device (1) has a further increased accuracy.

In an input device (1) of a third aspect referring to the second aspect, the pressure sensor (4) is preferably configured to output an electric signal including a change in electrostatic capacitance between a first electrode (6) and a second electrode (7, 7A). The clicking part (3) preferably has a dome shape and includes a dome body (31) which is electrically conductive and whose surface is the press surface (30). The first electrode (6) is preferably configured to receive the pushing force via the dome body (31) to be movable in a direction toward the second electrode (7, 7A). With the third aspect, the dome body (31) provides a preferred sense of click.

In an input device (1) of a fourth aspect referring to the third aspect, the second electrode (7A) preferably includes a first split part (71A) and a second split part (72A). The first split part (71A) and the second split part (72A) face the first electrode (6). The first split part (71A) and the second split part (72A) are preferably defined such that an area of a first region (R1) and an area of a second region (R2) are uneven between the first region (R1) and the second region (R2) when viewed from a front side of the press surface (30). The first region (R1) is a region in which the first electrode (6) and the first split part (71A) overlap each other when viewed from the front side of the press surface (30). The second region (R2) is a region in which the first electrode (6) and the second split part (72A) overlap each other when viewed from the front side of the press surface (30). With the fourth aspect, the second electrode (7A) is divided into two parts, that is, the first split part (71A) and the second split part (72A), and therefore, the sensitivity of the pressure sensitive unit (2A) can further be improved. For example, the input device (1) may receive an operation given by a fingertip (the operation body U1) wearing a glove, but the input device is hardly influenced by the glove in this case. Moreover, the area of the first region (R1) and the area of the second region (R2) are uneven therebetween, and therefore, the configuration of the fourth aspect is excellent in the sensitivity of the pressure sensitive unit (2) when the stroke reaches into the overpressure range.

In an input device (1) of a fifth aspect referring to the third or fourth aspect, the first electrode (6) preferably has a hole (61) penetrating the first electrode (6) in a thickness direction of the first electrode (6) and a projection member (62). The projection member (62) is disposed around the hole (61) and protrudes in a direction toward the clicking part (3). The dome body (31) preferably has a peripheral portion (310) to be placed on the projection member (62) and a tip (311) which passes through the hole (61) and approaches the second electrode (7, 7A) when the dome body (31) buckles in accordance with the pushing force. With the fifth aspect, the first electrode (6) has the projection member (62), and therefore, the fifth aspect can reduce the possibility that the summit part (311) comes into contact with an edge of the hole (61) when the dome body (31) whose shape and/or dimension varies case by case buckles. In other words, members can be made common in terms of the first electrode (6) without depending on the type of the dome body (31).

In an input device (1) of a sixth aspect referring to any one of the first to fifth aspects, the sensing unit (5) is preferably a capacitive sensor. The sixth aspect enables an input device (1) to have higher sensitivity than in the case where the sensing unit (5) is, for example, an optical sensor, an inductive sensor, or a magnetic sensor. In particular, even when the dimension of the input device (1) is substantially as large as the width of a fingertip of a person, the input device (1) has a further increased accuracy. Moreover, when the pressure sensor (4) is also a capacitive sensor, signals output from the pressure sensor (4) and the sensing unit (5) can be processed by one common controller (9).

In an input device (1) of a seventh aspect referring to any one of the first to sixth aspects, the sensing unit (5) preferably includes two sensing units (5). The two sensing units (5) are preferably aligned on both sides of the pressure sensitive unit (2, 2A) such that the pressure sensitive unit (2, 2A) is interposed between the two sensing units (5) when viewed from the front side of the press surface (30) of the pressure sensitive unit (2, 2A). With the seventh aspect, more various types of operations can be handled.

An input device (1) of an eighth aspect referring to any one of the first to seventh aspects preferably further includes a wall section (18) configured to support the sensing unit (5) such that a location of the sensing unit (5) in a direction intersecting the detection surface (the second detection surface S2) is aligned with a location of the press surface (30). With the eighth aspect, the sensing unit (5) can be disposed at a location closer to the surface of the housing (10). Moreover, also when the thickness dimension of the pressure sensitive unit (2, 2A) is greater than the thickness dimension of the sensing unit (5) depending on the clicking part (3) or the like, the location of the sensing unit (5) and the location of the press surface (30) can be aligned with each other. Thus, the sensitivity of the sensing unit (5) can be suppressed from being reduced.

An input system (100) of a ninth aspect includes the input device (1) of any one of the first to eighth aspects, a first acquirer (91), a second acquirer (92), and a determiner (93). The first acquirer (91) is configured to acquire a first signal output from the pressure sensor (4) of the pressure sensitive unit (2, 2A). The second acquirer (92) is configured to acquire a second signal output from the sensing unit (5). The determiner (93) is configured to determine, based on the first signal and the second signal, an operational state of the operation body (U1). The ninth aspect can provide the input system (100) including the input device (1) configured to handle various types of operations while reducing inhibitions against provision of a sense of click.

In an input system (100) of a tenth aspect referring to the ninth aspect, the operational state preferably includes directionality relating to movement of the operation body (U1) with respect to the pressure sensitive unit (2, 2A). With the tenth aspect, processes compatible with various types of operational states can be performed.

In an input system (100) of an eleventh aspect referring to the ninth or tenth aspect, the operational state preferably includes a mode relating to at least one process of a first operation process or a second operation process. The first operation process is an operation process in which the operation body (U1) comes in proximity to the press surface (30) and applies the pushing force to the press surface (30). The second operation process is an operation process in which the operation body (U1) moves away from the press surface (30) after the operation body (U1) applies the pushing force to the press surface (30). With the eleventh aspect, processes compatible with various types of operational states can be performed.

Note that the constituent elements of the second to eighth aspects are not essential constituent elements for the input device (1) but may be omitted as appropriate. Moreover, the constituent elements of the tenth and eleventh aspects are not essential constituent elements for the input system (100) and may accordingly omitted.

REFERENCE SIGNS LIST

1 INPUT DEVICE
2, 2A PRESSURE SENSITIVE UNIT
3 CLICKING PART
30 PRESS SURFACE
31 DOME BODY
310 PERIPHERAL PORTION
311 SUMMIT PART
4 PRESSURE SENSOR
5 SENSING UNIT
6 FIRST ELECTRODE
61 HOLE
62 PROJECTION MEMBER
7, 7A SECOND ELECTRODE
71, 71A FIRST SPLIT PART
72, 72A SECOND SPLIT PART
18 WALL SECTION
91 FIRST ACQUIRER
92 SECOND ACQUIRER
93 DETERMINER
100 INPUT SYSTEM
S2 SECOND DETECTION SURFACE (DETECTION SURFACE)
R1 FIRST REGION
R2 SECOND REGION
U1 OPERATION BODY

The invention claimed is:
1. An input device, comprising:
a pressure sensitive unit including:

a clicking part having a press surface and being configured to provide a sense of click to an operation body which applies pushing force to the press surface, and
a pressure sensor disposed on an opposite side of the clicking part from the press surface; and
a sensing unit aligned with the pressure sensitive unit when viewed from a front side of the press surface and configured to sense that the operation body comes in proximity to or touches a detection surface,
the pressure sensor being a capacitive sensor,
the pressure sensor being configured to output an electric signal including a change in electrostatic capacitance between a first electrode and a second electrode,
the clicking part having a dome shape and including a dome body which is electrically conductive and whose surface is the press surface, and
the first electrode being configured to receive the pushing force via the dome body to be movable in a direction toward the second electrode.

2. The input device of claim 1, wherein
the second electrode includes a first split part and a second split part, the first split part and the second split part facing the first electrode,
the first split part and the second split part are defined such that an area of a first region and an area of a second region are uneven between the first region and the second region when viewed from a front side of the press surface,
the first region is a region in which the first electrode and the first split part overlap each other when viewed from the front side of the press surface,
the second region is a region in which the first electrode and the second split part overlap each other when viewed from the front side of the press surface.

3. The input device of claim 1, wherein
the first electrode has:
a hole penetrating the first electrode in a thickness direction of the first electrode, and
a projection member disposed around the hole and protruding in a direction toward the clicking part,
the dome body has:
a peripheral portion to be placed on the projection member, and
a summit part which passes through the hole and approaches the second electrode when the dome body buckles in accordance with the pushing force.

4. The input device of claim 1, wherein the sensing unit is a capacitive sensor.

5. The input device of claim 1, wherein
the sensing unit includes two sensing units, and
the two sensing units are aligned on both sides of the pressure sensitive unit such that the pressure sensitive unit is interposed between the two sensing units when viewed from the front side of the press surface of the pressure sensitive unit.

6. The input device of claim 1, further comprising a wall section configured to support the sensing unit such that a location of the sensing unit in a direction intersecting the detection surface is aligned with a location of the press surface.

7. An input system, comprising:
an input device comprising:
a pressure sensitive unit including:
a clicking part having a press surface and being configured to provide a sense of click to an operation body which applies pushing force to the press surface, and
a pressure sensor disposed on an opposite side of the clicking part from the press surface, and
a sensing unit aligned with the pressure sensitive unit when viewed from a front side of the press surface and configured to sense that the operation body comes in proximity to or touches a detection surface;
a first acquirer configured to acquire a first signal output from the pressure sensor of the pressure sensitive unit;
a second acquirer configured to acquire a second signal output from the sensing unit; and
a determiner configured to determine, based on the first signal and the second signal, an operational state of the operation body.

8. The input system of claim 7, wherein the operational state includes directionality relating to movement of the operation body with respect to the pressure sensitive unit.

9. The input system of claim 7, wherein
the operational state includes at least one of:
a first operation process in which the operation body comes in proximity to the press surface and applies the pushing force to the press surface or
a second operation process in which the operation body moves away from the press surface after the operation body applies the pushing force to the press surface.

10. The input device of claim 2, wherein
the first electrode has:
a hole penetrating the first electrode in a thickness direction of the first electrode, and
a projection member disposed around the hole and protruding in a direction toward the clicking part,
the dome body has:
a peripheral portion to be placed on the projection member, and
a summit part which passes through the hole and approaches the second electrode when the dome body buckles in accordance with the pushing force.

11. The input device of claim 2, wherein the sensing unit is a capacitive sensor.

12. The input device of claim 3, wherein the sensing unit is a capacitive sensor.

13. The input device of claim 10, wherein the sensing unit is a capacitive sensor.

14. An input device, comprising:
a pressure sensitive unit including:
a clicking part having a press surface and being configured to provide a sense of click to an operation body which applies pushing force to the press surface, and
a pressure sensor disposed on an opposite side of the clicking part from the press surface,
the pressure sensor being a capacitive sensor,
the pressure sensor being configured to output an electric signal including a change in electrostatic capacitance between a first electrode and a second electrode,
the clicking part having a dome shape and including a dome body which is electrically conductive and whose surface is the press surface, and
the first electrode being configured to receive the pushing force via the dome body to be movable in a direction toward the second electrode.

15. The input device of claim 14, wherein the second electrode includes a first split part and a second split part, the first split part and the second split part facing the first electrode, the first split part and the second split part are defined such that an area of a first region and an area of a second region are uneven between the first region and the second region when viewed from a front side of the press surface, the first region is a region in which the first electrode and the first split part overlap each other when viewed from the front side of the press surface, the second region is a region in which the first electrode and the second split part overlap each other when viewed from the front side of the press surface.

16. The input device of claim 14, wherein
the first electrode has:
  a hole penetrating the first electrode in a thickness direction of the first electrode, and
  a projection member disposed around the hole and protruding in a direction toward the clicking part,
the dome body has:
  a peripheral portion to be placed on the projection member, and
  a summit part which passes through the hole and approaches the second electrode when the dome body buckles in accordance with the pushing force.

* * * * *